(12) United States Patent
Toriumi et al.

(10) Patent No.: US 9,628,096 B2
(45) Date of Patent: Apr. 18, 2017

(54) OSCILLATION CIRCUIT, OSCILLATOR, FRACTIONAL N-PLL CIRCUIT, ELECTRONIC APPARATUS, MOVING OBJECT, AND DETERMINATION METHOD OF REFERENCE FREQUENCY OF FRACTIONAL N-PLL CIRCUIT

(71) Applicant: Seiko Epson Corporation, Tokyo (JP)

(72) Inventors: Yuichi Toriumi, Fujimi (JP); Hayato Terashi, Minowa (JP); Mitsuaki Sawada, Fujimi (JP); Hisahiro Ito, Minowa (JP); Yasunari Furuya, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/607,343

(22) Filed: Jan. 28, 2015

(65) Prior Publication Data

US 2015/0214961 A1 Jul. 30, 2015

(30) Foreign Application Priority Data

Jan. 29, 2014 (JP) ................................. 2014-014342

(51) Int. Cl.
*H03L 7/08* (2006.01)
*H03L 7/197* (2006.01)

(52) U.S. Cl.
CPC .................................. *H03L 7/1976* (2013.01)

(58) Field of Classification Search
CPC .......... H03L 7/0802; H03L 7/099; H03B 5/32
USPC .............................................. 331/1 A, 16, 25
See application file for complete search history.

(56) References Cited

U.S. PATENT DOCUMENTS

| 4,516,083 | A | * | 5/1985 | Turney | H03L 7/107 331/1 A |
| 5,892,407 | A | * | 4/1999 | Ishii | H03L 7/093 327/156 |
| 6,081,164 | A | * | 6/2000 | Shigemori | G06F 1/08 257/E23.059 |
| 6,946,884 | B2 | * | 9/2005 | Holland | H03L 7/1976 327/115 |
| 7,653,359 | B2 | | 1/2010 | Darabi | |
| 8,305,115 | B2 | | 11/2012 | Bradley | |
| 8,509,296 | B2 | | 8/2013 | Inadomaru et al. | |
| 2010/0134159 | A1 | * | 6/2010 | Jin | H03L 7/087 327/156 |

FOREIGN PATENT DOCUMENTS

| JP | 08-008740 A | 1/1996 |
| JP | 2004-236141 A | 8/2004 |
| JP | 2011-128021 A | 6/2011 |

* cited by examiner

*Primary Examiner* — Jeffrey Shin
(74) *Attorney, Agent, or Firm* — Harness, Dickey & Pierce, P.L.C.

(57) ABSTRACT

In order to configure an oscillation circuit, an oscillator, a fractional N-PLL circuit, and the like that can output a plurality of frequencies, while decreasing an influence of an integer value boundary spurious at one reference frequency, the oscillation circuit includes a circuit for oscillation that oscillates a resonator, a fractional N-PLL circuit to which a signal from the circuit for oscillation is input, and a non-volatile memory that stores a plurality of division ratios, which can be selected from outside, of the fractional N-PLL circuit. A fractional portion of at least two of the plurality of division ratios is equal to or higher than 0.05 and is equal to or lower than 0.95.

3 Claims, 10 Drawing Sheets

FIG. 9A

| No. | OUTPUT FREQUENCY $f_o$[MHz] a=(b*(d+e))/c | REFERENCE FREQUENCY $f_{ref}$[MHz] b | OUTPUT DIVISION RATIO P c | INTEGER DIVISION RATIO N d | FRACTIONAL DIVISION RATIO F/M e | VCO FREQUENCY $f_{vco}$[MHz] f=a*c | N × $f_{ref}$ [MHz] g=b*d | (N+1) × $f_{ref}$ [MHz] h=b*(d+1) | FIRST DETUNING FREQUENCY [MHz] i=|f-g| | SECOND DETUNING FREQUENCY [MHz] j=|f-h| | IBS FREQUENCY [MHz] k=min(i,j) |
|---|---|---|---|---|---|---|---|---|---|---|---|
| 1 | 162.492583 | 114.144444 | 16 | 22 | 0.777117 | 2599.881328 | 2511.177768 | 2625.322212 | 88.703560 | 25.440884 | 25.440884 |
| 2 | 174.703084 | 114.144444 | 16 | 24 | 0.488703 | 2795.249344 | 2739.466656 | 2853.611100 | 55.782688 | 58.361756 | 55.782688 |
| 3 | 699.326000 | 114.144444 | 4 | 24 | 0.506703 | 2797.304000 | 2739.466656 | 2853.611100 | 57.837344 | 56.307100 | 56.307100 |
| 4 | 724.032902 | 114.144444 | 4 | 25 | 0.372515 | 2896.131608 | 2853.611100 | 2967.755544 | 42.520508 | 71.623936 | 42.520508 |

FIG. 9B

| No. | OUTPUT FREQUENCY $f_o$[MHz] a=(b*(d+e))/c | REFERENCE FREQUENCY $f_{ref}$[MHz] b | OUTPUT DIVISION RATIO P c | INTEGER DIVISION RATIO N d | FRACTIONAL DIVISION RATIO F/M e | VCO FREQUENCY $f_{vco}$[MHz] f=a*c | N × $f_{ref}$ [MHz] g=b*d | (N+1) × $f_{ref}$ [MHz] h=b*(d+1) | FIRST DETUNING FREQUENCY [MHz] i=|f-g| | SECOND DETUNING FREQUENCY [MHz] j=|f-h| | IBS FREQUENCY [MHz] k=min(i,j) |
|---|---|---|---|---|---|---|---|---|---|---|---|
| 1 | 162.492583 | 100.000000 | 16 | 25 | 0.998813 | 2599.881328 | 2500.000000 | 2600.000000 | 99.881328 | 0.118672 | 0.118672 |
| 2 | 174.703084 | 100.000000 | 16 | 27 | 0.952493 | 2795.249344 | 2700.000000 | 2800.000000 | 95.249344 | 4.750656 | 4.750656 |
| 3 | 699.326000 | 100.000000 | 4 | 27 | 0.973040 | 2797.304000 | 2700.000000 | 2800.000000 | 97.304000 | 2.696000 | 2.696000 |
| 4 | 724.032902 | 100.000000 | 4 | 28 | 0.961316 | 2896.131608 | 2800.000000 | 2900.000000 | 96.131608 | 3.868392 | 3.868392 |

US 9,628,096 B2

OSCILLATION CIRCUIT, OSCILLATOR, FRACTIONAL N-PLL CIRCUIT, ELECTRONIC APPARATUS, MOVING OBJECT, AND DETERMINATION METHOD OF REFERENCE FREQUENCY OF FRACTIONAL N-PLL CIRCUIT

BACKGROUND

1. Technical Field

The present invention relates to an oscillation circuit, an oscillator, a fractional N-PLL circuit, an electronic apparatus, a moving object, and a determination method of a reference frequency of the fractional N-PLL circuit.

2. Related Art

An oscillator is known, in which a fractional N-PLL is connected to a rear stage of an oscillation circuit, and by changing a setting of a division ratio of the fractional N-PLL from an outer terminal, a plurality of frequencies can be output. In this type of oscillator, a fractional division ratio is determined such that a desired frequency which is obtained by fractionally dividing a reference frequency using a fractional N-PLL is obtained, but a frequency in which an integer value boundary spurious is generated is changed according to the fractional division ratio, and thus there is a case where phase noise or phase jitter of an oscillator is generated by an influence of the integer value boundary spurious, according to a relationship between a spurious frequency and an output frequency.

In contrast to this, in a frequency converter described in U.S. Pat. No. 8,305,115, an action is taken such that an integer value boundary spurious is not generated within a loop bandwidth, by switching two types of frequencies in order to use as a reference frequency of a fractional N-PLL.

However, there is a problem that, in a method described in U.S. Pat. No. 8,305,115, two resonators are required to generate two types of reference frequencies, and there are many factors that become an obstacle in miniaturization and cost reduction, thereby being negative in terms of reliability. In this way, in the related art, in a case where a plurality of frequencies are generated by a fractional N-PLL, there is a method for decreasing the integer value boundary spurious using a plurality of resonators (reference frequencies), but there is no method for enabling a plurality of frequencies to be output, while decreasing an influence of the integer value boundary spurious using one resonator (reference frequency).

SUMMARY

An advantage of some aspects of the invention is to provide an oscillation circuit that enables a plurality of frequencies to be output while decreasing an influence of an integer value boundary spurious at one reference frequency, an oscillator, and a fractional N-PLL circuit. Another advantage of some aspects of the invention is to provide an electronic apparatus and a moving object that have a high reliability and use the oscillation circuit. Still another advantage of some aspects of the invention is to provide a determination method of a reference frequency of a fractional N-PLL circuit for determining a reference frequency that enables a plurality of frequencies to be output while decreasing an influence of an integer value boundary spurious.

The invention can be implemented as the following forms or application examples.

APPLICATION EXAMPLE 1

This application example is directed to an oscillation circuit including: a circuit for oscillation that oscillates a resonator; a fractional N-PLL circuit to which a signal from the circuit for oscillation is input; and a storage unit that stores a plurality of division ratios, which can be selected from outside, of the fractional N-PLL circuit, in which a fractional portion of at least two of the plurality of division ratios is equal to or higher than 0.05 and is equal to or lower than 0.95.

The circuit for oscillation may be a portion of various oscillation circuits, such as a Pierce oscillation circuit, an inverter type oscillation circuit, a Colpitts oscillation circuit, or a Hartley oscillation circuit.

According to the oscillation circuit of this application example, a fractional portion of at least two division ratios that are stored is equal to or more than 0.05 and is equal to or less than 0.95, and thus, in a case where the fractional N-PLL circuit is set to any one of the division ratios, a detuning frequency becomes relatively high, and the integer value boundary spurious is easily attenuated. Therefore, according to this application example, it is possible to provide an oscillation circuit that enables a plurality of frequencies to be output while decreasing an influence of the integer value boundary spurious at one reference frequency.

APPLICATION EXAMPLE 2

In the oscillation circuit according to the application example described above, fractional portions of all the plurality of division ratios may be equal to or higher than 0.05 and are equal to or lower than 0.95.

According to the oscillation circuit of this application example, it is possible to decrease an influence of the integer value boundary spurious, even though the fractional N-PLL circuit is set to any one of the plurality of division ratios that are stored.

APPLICATION EXAMPLE 3

This application example is directed to an oscillation circuit including: a circuit for oscillation that oscillates a resonator; a fractional N-PLL circuit to which a signal from the circuit for oscillation is input; and a storage unit that stores a plurality of division ratios, which can be selected from outside, of the fractional N-PLL circuit, in which in a case where any one of at least two of the plurality of division ratios is selected, a detuning frequency between an output frequency of an oscillation unit included in the fractional N-PLL circuit and a frequency that is an integer multiple of a reference frequency is higher than a cutoff frequency of a loop filter included in the fractional N-PLL circuit.

According to the oscillation circuit of this application example, in a case where the fractional N-PLL circuit is set to any one of at least two division ratios that are stored, the integer value boundary spurious is attenuated by a loop filter of the fractional N-PLL circuit. Therefore, according to this application example, it is possible to provide an oscillation circuit that enables a plurality of frequencies to be output while decreasing an influence of the integer value boundary spurious at one reference frequency.

APPLICATION EXAMPLE 4

In the oscillation circuit according to the application example described above, in a case where any one of the plurality of division ratios is selected, the detuning frequency may be higher than the cutoff frequency.

According to the oscillation circuit of this application example, it is possible to decrease an influence of the integer value boundary spurious, even though the fractional N-PLL circuit is set to any one of the plurality of division ratios that are stored.

APPLICATION EXAMPLE 5

This application example is directed to an oscillator including: any one of the oscillation circuits described above, and a resonator.

According to the oscillator of this application example, the oscillator includes an oscillation circuit that enables a plurality of frequencies to be output while decreasing an influence of the integer value boundary spurious at one reference frequency, and thus the resonator may be one piece, and it is possible to realize miniaturization and a low cost while practicability or reliability is secured.

APPLICATION EXAMPLE 6

This application example is directed to a fractional N-PLL circuit which divides a determined reference frequency, and in which a fractional portion of a division ratio that is set so as to output each of at least two frequencies of a plurality of frequencies that are determined is equal to or more than 0.05 and is equal to or less than 0.95.

According to the fractional N-PLL circuit of this application example, a fractional portion of at least two division ratios that are determined is equal to or more than 0.05 and is equal to or less than 0.95, and thus, in a case where the fractional N-PLL circuit is set to any one of the division ratios, a detuning frequency becomes relatively high, and an integer value boundary spurious is easily attenuated by a loop filter. Therefore, according to this application example, it is possible to provide a fractional N-PLL circuit that enables a plurality of frequencies to be output while decreasing an influence of the integer value boundary spurious at one reference frequency, with respect to one reference frequency.

APPLICATION EXAMPLE 7

This application example is directed to a fractional N-PLL circuit which divides a determined reference frequency, and when each of at least two frequencies of a plurality of frequencies that are determined is output, a detuning frequency between an output frequency of an oscillation unit and a harmonic frequency that is an integer multiple of the reference frequency is higher than a cutoff frequency of a loop filter.

According to the fractional N-PLL circuit of this application example, in a case where the fractional N-PLL circuit is set to any one of at least two division ratios, an integer value boundary spurious is attenuated by a loop filter. Therefore, according to this application example, it is possible to provide a fractional N-PLL circuit that enables a plurality of frequencies to be output while decreasing an influence of the integer value boundary spurious at one reference frequency.

APPLICATION EXAMPLE 8

This application example is directed to an electronic apparatus including: any one of the oscillation circuits described above, or any one of the fractional N-PLL circuits described above.

APPLICATION EXAMPLE 9

This application example is directed to a moving object including: any one of the oscillation circuits described above, or any one of the fractional N-PLL circuits described above.

According to the electronic apparatus and the moving object of these application examples, the electronic apparatus and the moving object respectively include an oscillation circuit or a fractional N-PLL circuit that enables a plurality of frequencies to be output while decreasing an influence of the integer value boundary spurious at one reference frequency, and thus it is possible to realize a high practicability or reliability.

APPLICATION EXAMPLE 10

This application example is directed to a determining method of a reference frequency of a fractional N-PLL circuit including: calculating a detuning frequency between each of a plurality of output frequencies of an oscillation unit included in the fractional N-PLL circuit and a harmonic frequency that is an integer multiple of a reference frequency, with regard to each of a plurality of reference frequencies of the fractional N-PLL circuit; calculating the sum of reciprocals of a plurality of detuning frequencies, or the sum of the plurality of detuning frequencies, with regard to each of the plurality of reference frequencies; and selecting one of the plurality of reference frequencies, based on the sum of reciprocals of the detuning frequencies, or the sum of the detuning frequencies.

According to the determining method of a reference frequency of a fractional N-PLL circuit of this application example, it is possible to determine a reference frequency that can decrease an influence of an integer value boundary spurious which is generated in a case where each of a plurality of output frequencies of the oscillation unit is selected.

BRIEF DESCRIPTION OF THE DRAWINGS

The invention will be described with reference to the accompanying drawings, wherein like numbers reference like elements.

FIGS. 9A and 9B are diagrams illustrating an example of reference frequencies and division ratio set values.

DESCRIPTION OF EXEMPLARY EMBODIMENTS

Hereinafter, preferred embodiments of the invention will be described in detail with reference to the drawings. In addition, the embodiments that will be described hereinafter are not intended to unduly limit the content of the invention described in the appended claims. In addition, all of the configurations that will be described hereinafter are not limited to essential configuration requirements of the invention.

1. Oscillator
Configuration of Oscillator

Figure 1:
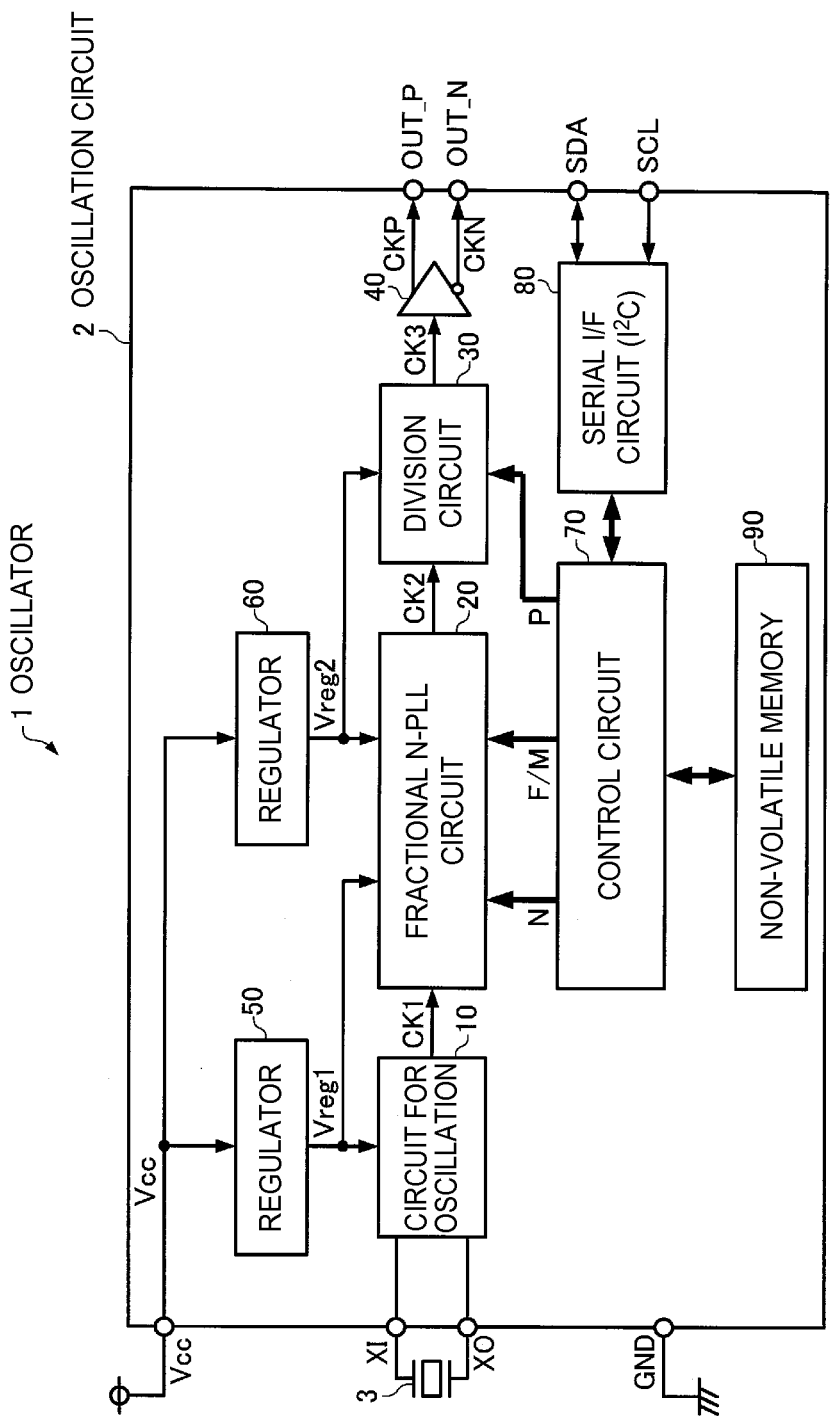
FIG. 1 is a configuration diagram of an oscillator according to the present embodiment.

FIG. 1 is a configuration diagram of an oscillator according to the present embodiment. As illustrated in FIG. 1, the oscillator 1 according to the present embodiment is an oscillator including an oscillation circuit 2 and a resonator 3, and the oscillation circuit 2 and the resonator 3 are packaged in a package that is not illustrated.

In the present embodiment, the resonator 3 is a quartz crystal resonator that uses a quartz crystal as a substrate material, and uses a quartz crystal resonator such as AT-cut or SC-cut. The resonator 3 may be a surface acoustic wave (SAW) resonator or a micro electromechanical systems (MEMS) resonator. In addition, as a substrate material of the resonator 3, in addition to a quartz crystal, a piezoelectric material, such as, a piezoelectric single crystal such as lithium tantalite or lithium niobate, and a piezoelectric material such as lead zirconate titanate, a silicon semiconductor material, or the like can be used. As an excitation unit of the resonator 3, a unit using piezoelectric effects may be used, and an electrostatic drive caused by a Coulomb force may be used.

The oscillation circuit 2 includes a Vcc terminal that is a power supply terminal, a GND terminal that is a ground terminal, an OUT_P terminal and OUT_N terminal that are differential output terminals, an SDA terminal and an SCL terminal that are used for an outer interface, and an XI terminal and an XO terminal that are connection terminals of the resonator 3. The Vcc terminal, the GND terminal, the OUT_P terminal, the OUT_N terminal, the SDA terminal, and the SCL terminal are also connected to outer terminals (not illustrated) of the oscillator 1.

In the present embodiment, the oscillation circuit 2 is configured to include a circuit for oscillation 10, a fractional N-PLL circuit 20, a division circuit 30, an output circuit 40, a regulator 50, a regulator 60, a control circuit 70, a serial interface (I/F) circuit 80, and a non-volatile memory 90. In addition, in the oscillation circuit 2 according to the present embodiment, a portion of those elements may be omitted or modified, and alternatively, other components may be added. The oscillation circuit 2 may be a semiconductor integrated circuit (IC) that is configured by one-chip, may be configured by an IC with a plurality of chips, and a portion of the oscillation circuit 2 may be configured by discrete components.

The circuit for oscillation 10 is a circuit for oscillating the resonator 3, amplifies an output signal of the resonator 3, and feeds the amplified signal back to the resonator 3. The circuit for oscillation 10 outputs an oscillation signal CK1 based on the oscillation of the resonator 3.

The fractional N-PLL circuit 20 generates an oscillation signal CK2 that is generated by multiplying a frequency (reference frequency) of the oscillation signal CK1, according to a division ratio that is input from the control circuit 70. Here, if an integer portion (integer division ratio) of the division ratio is represented by N and a fractional portion (fractional division ratio) is represented by F/M, a relationship of the following Equation (1) is established between a frequency $f_{CK1}$ of the oscillation signal CK1 and a frequency $f_{CK2}$ of the oscillation signal CK2.

$$f_{CK2} = \left(N + \frac{F}{M}\right) \times f_{CK1} \tag{1}$$

The division circuit 30 divides the oscillation signal CK2 that is output from the fractional N-PLL circuit 20 by an output division ratio P (P is an integer equal to or larger than 1) that is input from the control circuit 70, and generates an oscillation signal CK3. Here, a relationship of the following Equation (2) is established between the frequency $f_{CK2}$ of the oscillation signal CK2 and a frequency $f_{CK3}$ of the oscillation signal CK3.

$$f_{CK3} = \frac{f_{CK2}}{P} \tag{2}$$

Thus, by Equation (1) and Equation (2), a relationship of the following Equation (3) is established between the frequency $f_{CK1}$ of the oscillation signal CK1 and the frequency $f_{CK3}$ of the oscillation signal CK3.

$$f_{CK3} = \left(N + \frac{F}{M}\right) \times \frac{f_{CK1}}{P} \tag{3}$$

The output circuit 40 converts the oscillation signal CK3 that is output from the division circuit 30 into a differential signal that is configured by a non-inverting signal CKP and an inverting signal CKN. The non-inverting signal CKP is output from the output terminal OUT_P to an outer portion, and the inverting signal CKN is output from the output terminal OUT_N to an outer portion. The output circuit 40 may be a differential output circuit, such as a low voltage differential signaling (LVDS) circuit, a positive emitter coupled logic (PECL) circuit, or a low voltage PECL (LVPECL) circuit. However, the output circuit 40 may be a single-ended output circuit.

The regulator 50 generates a constant voltage Vreg1 lower than the Vcc, based on the power supply voltage Vcc that is supplied from the Vcc terminal. The constant voltage Vreg1 is supplied as a power supply voltage of the circuit for oscillation 10 and a power supply voltage of a partial circuit of the fractional N-PLL circuit 20.

The regulator 60 generates a constant voltage Vreg2 lower than the Vcc, based on the power supply voltage Vcc that is supplied from the Vcc terminal. The constant voltage Vreg2 is supplied as a power supply voltage of the partial circuit of the fractional N-PLL circuit 20 and a power supply voltage of the division circuit 30.

In the present embodiment, the constant voltage Vreg1 and the constant voltage Vreg2 are the same voltage, but as long as a malfunction is not generated in an interface portion between a circuit that uses Vreg2 as a power supply voltage and a circuit that uses Vreg1 as a power supply voltage, Vreg1 may be different from Vreg2.

In the present embodiment, the serial interface circuit 80 is a digital interface with $I^2C$ standard, a serial data signal is input or output from the SDA terminal, and a clock signal is input from the SCL terminal. The present embodiment is configured in such a manner that data can be read from or written to a control register or a non-volatile memory 90 that is not illustrated and is included in the control circuit 70, from an external device, via the SDA terminal, the SCL terminal, and the serial interface circuit 80. In addition, the serial interface circuit 80 may be an interface circuit with a communication standard other than the $I^2C$ standard.

Particularly, in a case where the resonator 3 with the determined resonance frequency is connected to the oscillation circuit 2, the oscillator 1 according to the present embodiment is configured in such a manner that any one of n types of frequencies which is determined in advance as an output frequency $f_o$ (differential signals CKP and CKN of output frequency) is briefly selected from an external device. Specifically, n (n≥2) division ratio set values, which correspond to an integer division ratio N and a fractional division ratio F/M of the fractional N-PLL circuit 20, and an output division ratio P of a division circuit, are stored in advance in the non-volatile memory 90. According to a value that is set to a division ratio selection register which is one of the control registers by an external device, the control circuit 70 reads one division ratio set value (integer division ratio N, fractional division ratio F/M, and set value of output division ratio P) that is stored in the non-volatile memory 90, sets the read integer division ratio N and the read fractional division ratio F/M in the fractional N-PLL circuit 20, and sets the read output division ratios P in the division circuit 30. As a result, if the resonator 3 of the determined resonance frequency is connected, the output frequency $f_{CK1}$ (reference frequency $f_{ref}$ of fractional N-PLL circuit 20) of the circuit for oscillation is fixed, and thus the output frequency $f_o$ (=$f_{CK3}$) becomes a predetermined frequency that is determined by Equation (3), according to the integer division ratio N, the fractional division ratio F/M, and the output division ratio P that are selected.

For example, in a case where the oscillator 1 is used for optical communication, frequencies that are required for each communication standard are different from each other, and thus a type of the resonator 3 to be connected is determined by one piece, in such a manner that n types of frequencies which can be selected as the output frequency of the resonator 1 match n types of frequencies that are required by n types of communication standards, respectively. After that, n division ratio set values which are calculated in such a manner that n types of desired frequencies can be output are written in advance in the non-volatile memory 90.

In addition, one of the n types of division ratio set values that are stored in the non-volatile memory 90 may be able to be selected, and the integer division ratio N, the fractional division ratio F/M, and the output division ratio P, respectively, may be able to be arbitrarily set from an external device via the serial interface circuit 80.

Configuration of Fractional N-PLL Circuit

Figure 2:
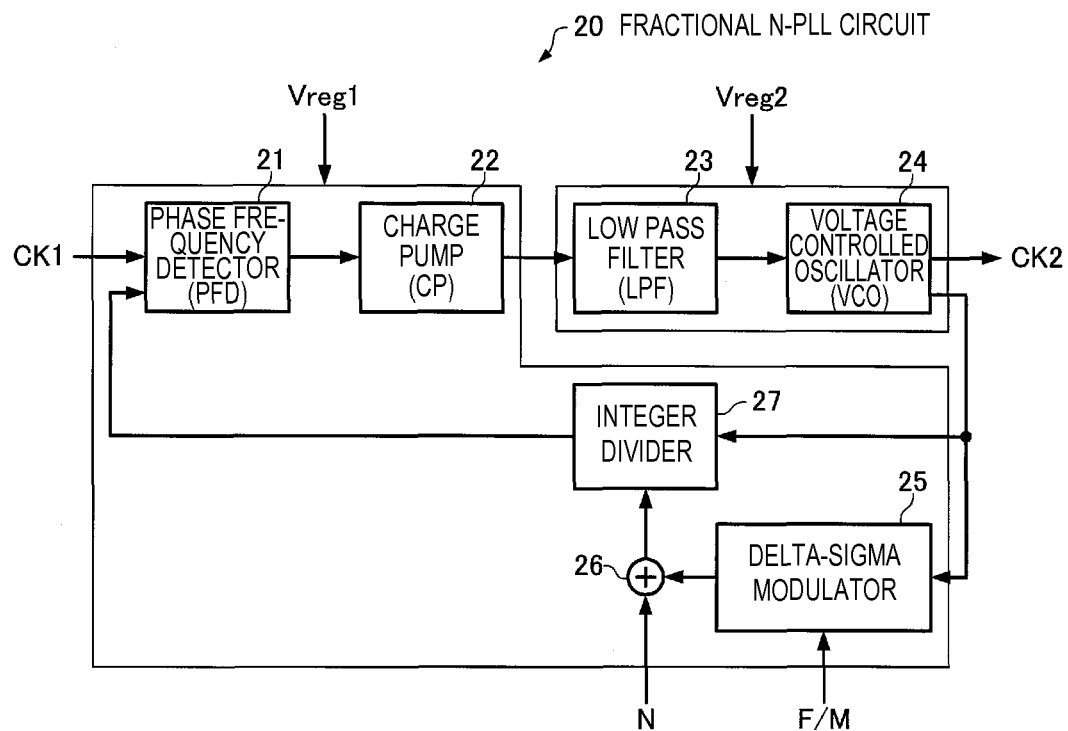
FIG. 2 is a diagram illustrating a configuration example of a fractional N-PLL circuit.

FIG. 2 is a diagram illustrating a configuration example of the fractional N-PLL circuit 20 of FIG. 1. As illustrated in FIG. 2, the fractional N-PLL circuit 20 is configured to include a phase frequency detector (PFD) 21, a charge pump (CP) 22, a low pass filter (LPF) 23, a voltage controlled oscillator (VCO) 24, a delta-sigma modulator 25, an adder 26, and a integer divider 27.

The phase frequency detector 21 compares a phase of an oscillation signal CK1 that is output from the circuit for oscillation 10 with a phase of the output signal of the integer divider 27, and outputs the compared result as a pulse voltage.

The charge pump 22 converts the pulse voltage that is output from the phase frequency detector 21 into a current. The low pass filter 23 smoothes the current that is output from the charge pump 22 and converts the current into a voltage.

The voltage controlled oscillator 24 (an example of oscillation unit) outputs the oscillation signal CK2, an oscillation frequency of which is changed, according to the output voltage of the low pass filter 23.

The delta-sigma modulator 25 integrates the fractional division ratio F/M, and outputs a signal that is obtained by quantizing the integrated fractional division ratio.

The adder 26 outputs a signal (N or N+1) that is obtained by adding the output signal (0 or 1) of the delta-sigma modulator 25 to the integer division ratio N.

The integer divider 27 outputs a signal that is obtained by dividing the oscillation signal CK2 using the output signal (N or N+1) of the adder 26 as a division ratio.

The fractional N-PLL circuit 20 performs a fractional division as an average by modulating the signal of the integer divider 27 according to the output signal of the delta-sigma modulator 25, and outputs the oscillation signal CK2 with the frequency (output frequency) $f_{CK2}$ that is obtained by fraction-multiplying (N+F/M times) the oscillation signal CK1 with the frequency $f_{CK1}$ (reference frequency $f_{ref}$), as represented by Equation (1).

Figure 3:
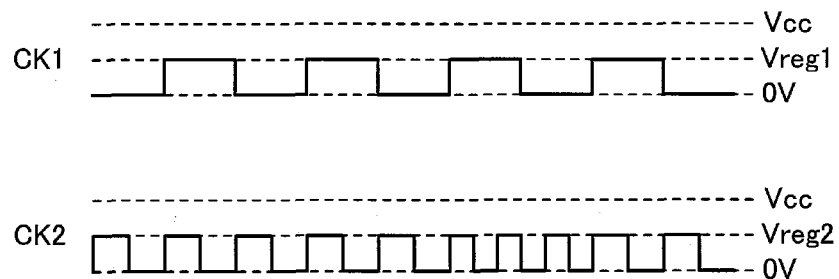
FIG. 3 is a waveform diagram of an oscillation signal.

In the present embodiment, the constant voltage Vreg1 is supplied to the phase frequency detector 21, the charge pump 22, the delta-sigma modulator 25, the adder 26, and the integer divider 27, as a power supply voltage, in the same manner as the circuit for oscillation 10. Also, the constant voltage Vreg2 different from the constant voltage Vreg1 is supplied to the low pass filter 23 and the voltage controlled oscillator 24, as a power supply voltage. Thus, as illustrated in FIG. 3, while a high level of the oscillation signal CK1 is Vreg1, a high level of the oscillation signal CK2 is Vreg2. In this way, by separating a power supply of a circuit that operates at the reference frequency from a power supply of a circuit that operating at the output frequency, voltage variance of the constant voltage Vreg1 with noise of the reference frequency does not overlap the constant voltage Vreg2 that operates at the output frequency, and thus it is possible to decrease noise overlapping the oscillation signal CK2.

In addition, in the present embodiment, the circuit for oscillation 10 is configured to output the oscillation signal CK1 with an amplitude (small amplitude) of the voltage Vreg1 lower than the power supply voltage Vcc which is supplied from the Vcc terminal to the fractional N-PLL circuit 20. In this way, by making the oscillation signal CK1 have a small amplitude, energy that is required for transmission and reception of the oscillation signal CK1 between the circuit for oscillation 10 and the fractional N-PLL circuit 20 is decreased, and an amount of noise that is mixed into the voltage controlled oscillator 24 can be decreased.

Thus, it is possible to decrease phase noise or phase jitter of the output signal of the oscillator 1.

Decreasing Method of Integer Value Boundary Spurious

In general, when phase noise characteristics of the output signal of the fractional N-PLL circuit are measured at a desired range at a detuning frequency (offset frequency) as a horizontal axis, a signal with a difference frequency (detuning frequency) between a frequency of harmonic that is an integer multiple of the reference frequency and the output frequency appears as the integer value boundary spurious (IBS). In a case where the reference frequency is constant, The frequency in which the integer value boundary spurious is generated is changed by setting of the fractional division ratio of the fractional N-PLL circuit.

Figure 4:
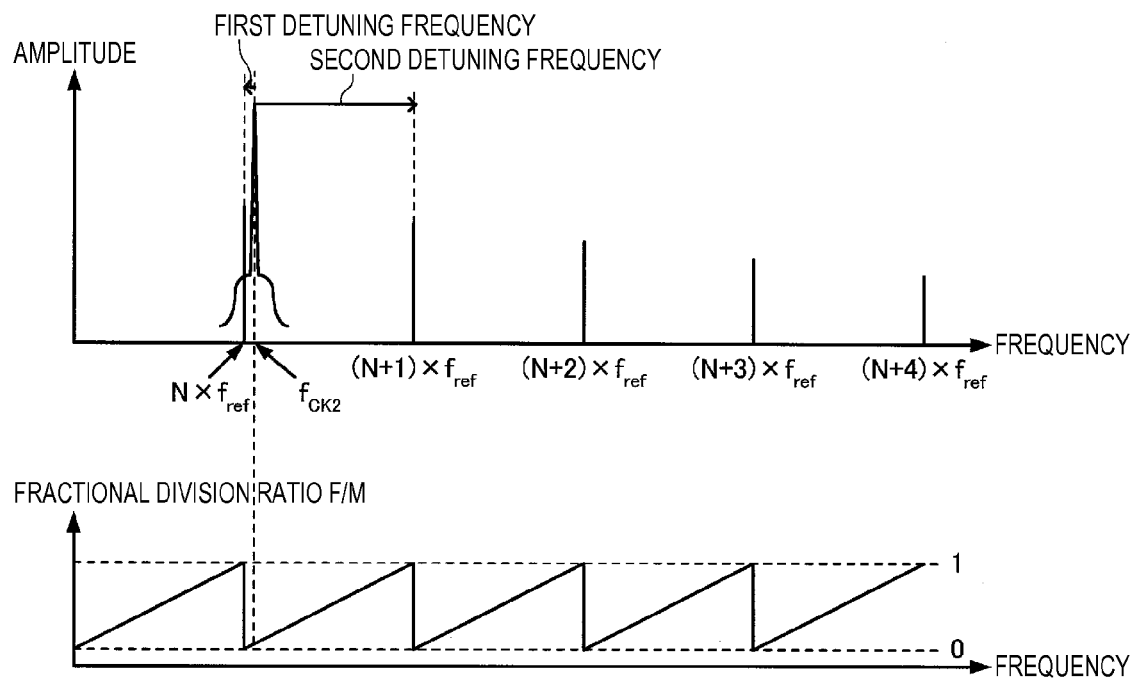
FIG. 4 is a diagram illustrating one example of a frequency spectrum of an output signal of the fractional N-PLL circuit.
Figure 5:
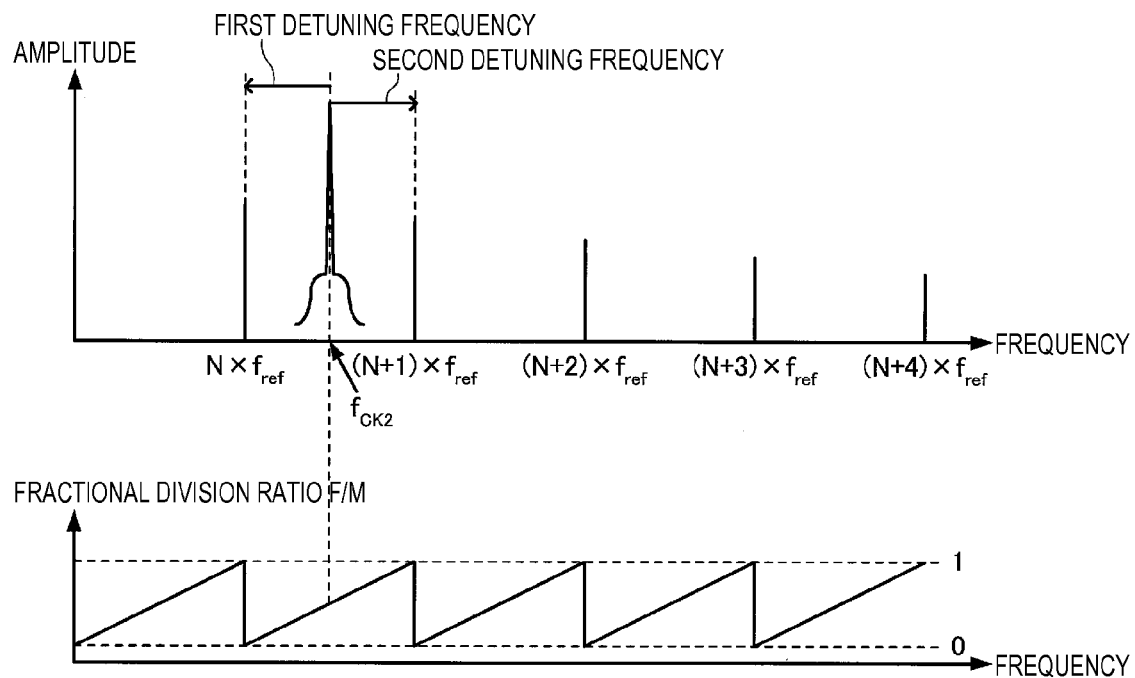
FIG. 5 is a diagram illustrating another example of the frequency spectrum of the output signal of the fractional N-PLL circuit.
Figure 6:
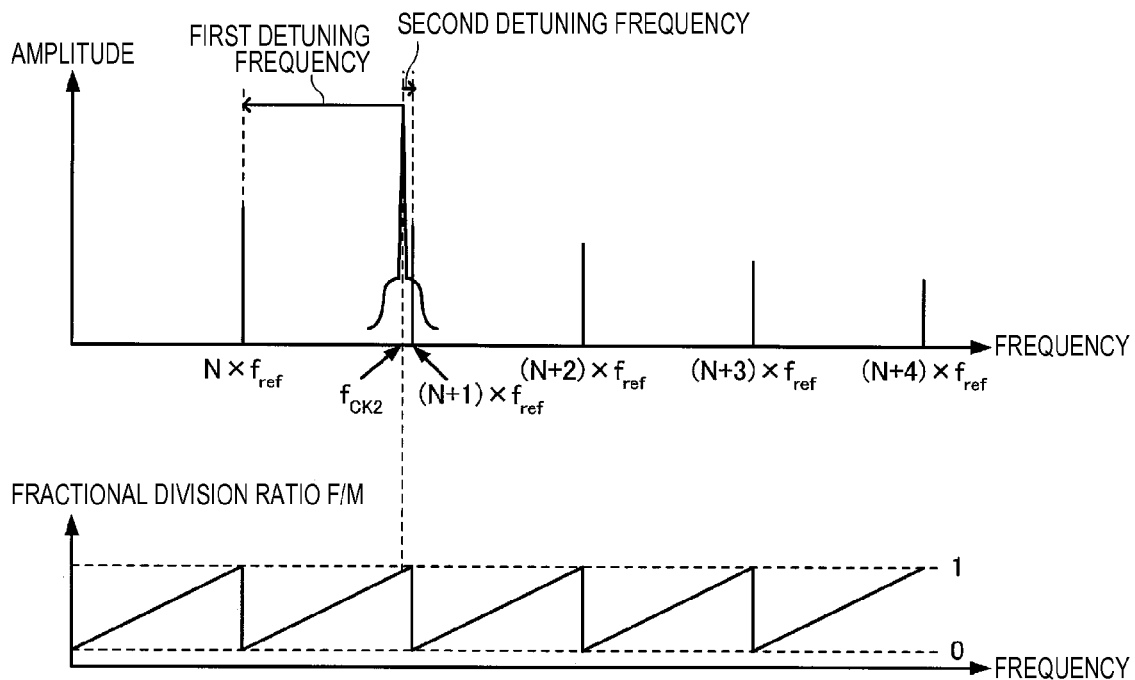
FIG. 6 is a diagram illustrating still another example of the frequency spectrum of the output signal of the fractional N-PLL circuit.

FIGS. 4 to 6 illustrate states where the frequency (detuning frequency) in which the integer value boundary spurious is generated is changed according to the setting of the fractional division ratio of the fractional N-PLL circuit. In each of FIGS. 4 to 6, in an upper stage, a frequency spectrum of the output signal of the fractional N-PLL circuit is illustrated, in which a horizontal axis denotes a frequency and a vertical axis denotes an amplitude, and in a lower stage, a graph is illustrated, in which a horizontal axis denotes a frequency and a vertical axis denotes a fractional division ratio F/M. Scales of two horizontal axes of the upper stage and the lower stage are the same.

FIG. 4 is a diagram in a case where the fractional division ratio F/M is close to zero, an absolute value $|f_{CK2} - N \times f_{ref}|$ (first detuning frequency) of a difference between the output frequency (output frequency of the voltage controlled oscillator 24) $f_{CK2}$ of the fractional N-PLL circuit and a frequency that is N times the reference frequency $f_{ref}(=f_{CK1})$ is small, and an absolute value $|f_{CK2} - (N+1) \times f_{ref}|$ (second detuning frequency) of a difference between the output frequency $f_{CK2}$ and a frequency that is (N+1) times as much as the reference frequency $f_{ref}(=f_{CK1})$ is large. Thus, the integer value boundary spurious is generated at a relatively low frequency (first detuning frequency) and a relatively high frequency (second detuning frequency).

FIG. 5 is a diagram in a case where the fractional division ratio F/M is close to 0.5, an absolute value $|f_{CK2} - N \times f_{ref}|$ (first detuning frequency) of a difference between the output frequency (output frequency of the voltage controlled oscillator 24) $f_{CK2}$ of the fractional N-PLL circuit and a frequency that is N times the reference frequency $f_{ref}(f_{CK1})$ is large, and also an absolute value $|f_{CK2} - (N+1) \times f_{ref}|$ (second detuning frequency) of a difference between the output frequency $f_{CK2}$ and a frequency that is (N+1) times as much as the reference frequency $f_{ref}(=f_{CK1})$ is large. Thus, the integer value boundary spurious is generated at a relatively high frequency (first detuning frequency, second detuning frequency).

FIG. 6 is a diagram in a case where the fractional division ratio F/M is close to 1, an absolute value $|f_{CK2} - N \times f_{ref}|$ (first detuning frequency) of a difference between the output frequency (output frequency of the voltage controlled oscillator 24) $f_{CK2}$ of the fractional N-PLL circuit and a frequency that is N times the reference frequency $f_{ref}(=f_{CK1})$ is large, and an absolute value $|f_{CK2} - (N+1) \times f_{ref}|$ (second detuning frequency) of a difference between the output frequency $f_{CK2}$ and a frequency that is (N+1) times as much as the reference frequency $f_{ref}(=f_{CK1})$ is small. Thus, the integer value boundary spurious is generated at a relatively high frequency (first detuning frequency) and a relatively low frequency (second detuning frequency).

In contrast, if being generated within a loop bandwidth of the fractional N-PLL circuit, the integer value boundary spurious appears in the output signal of the fractional N-PLL circuit without being decreased, and thus phase noise or phase jitter is generated.

Figure 7:
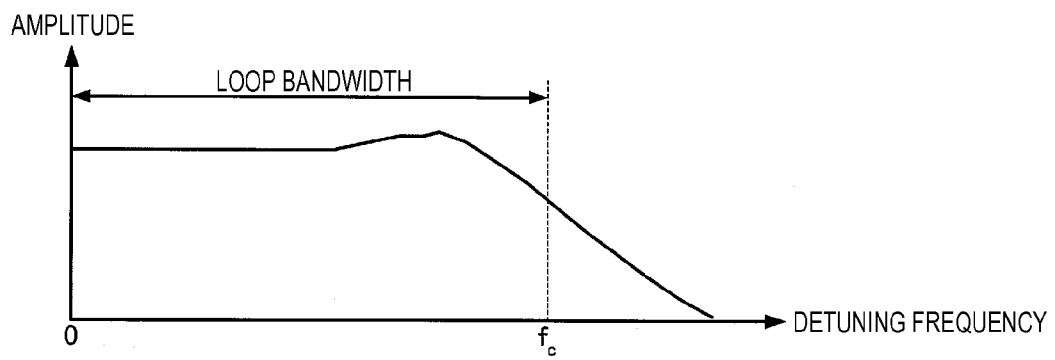
FIG. 7 is a diagram illustrating an example of frequency characteristics of a low pass filter included in the fractional N-PLL circuit.

Also in the present embodiment, in the output signal of the fractional N-PLL circuit 20, the integer value boundary spurious is generated at a detuning frequency according to the fractional division ratio F/M, but if the reference frequency is a predetermined frequency, although one of at least two division ratio set values is selected, among the n division ratio set values (integer division ratios N, fractional division ratio F/M, and set value of output division ratio P) that are stored in the above-described non-volatile memory 90, the integer value boundary spurious is generated out of a loop bandwidth of the fractional N-PLL circuit 20. Here, in the present embodiment, as illustrated in FIG. 7, a frequency bandwidth equal to or lower than a cutoff frequency $f_c$ of the low pass filter 23 (refer to FIG. 2) that is included in the fractional N-PLL circuit 20 is set as the loop bandwidth. Thus, in the integer value boundary spurious that is generated out of the loop bandwidth, the power is attenuated to a value equal to or lower than at least a half, if passing through the low pass filter 23 that functions as a loop filter, and thus an influence of phase noise or phase jitter is decreased.

More preferably, if the reference frequency is a predetermined frequency, although one of the n division ratios set values that are stored in the non-volatile memory 90 is selected, the integer value boundary spurious is generated out of the loop bandwidth of the fractional N-PLL circuit 20. However, it is actually difficult to generate the integer value boundary spurious out of the loop bandwidth with regard to all combinations as n is increased, and thus it is allowable that, in a case where one of at least the two division ratio set values is selected, the integer value boundary spurious is generated out of the loop bandwidth, and in a case where the other division ratio set values are selected, the integer value boundary spurious is generated within the loop bandwidth.

In addition, if the integer value boundary spurious is generated out of the loop bandwidth, it is possible to effectively control the phase noise or the phase jitter, but actually, although the integer value boundary spurious is generated at a slightly lower frequency than the cutoff frequency $f_c$ (approximately 5 to 10 MHz) of the low pass filter 23, it is considered that phase noise or phase jitter is substantially generated. Accordingly, the reference frequency is maintained constant, while setting of the fractional division ratio F/M is changed, the phase jitter is actually measured, and boundary conditions in which phase jitter is generated are obtained.

Figure 8A:
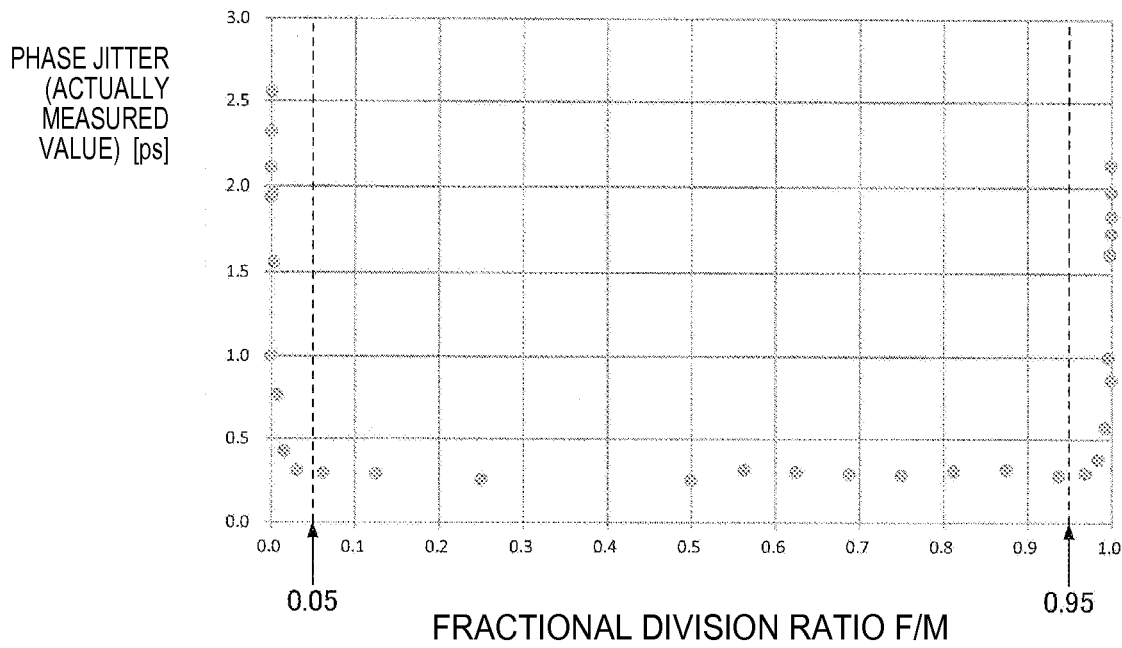
FIG. 8A is a diagram illustrating a relationship between a fractional division ratio and an actually measured value of phase jitter.
Figure 8B:
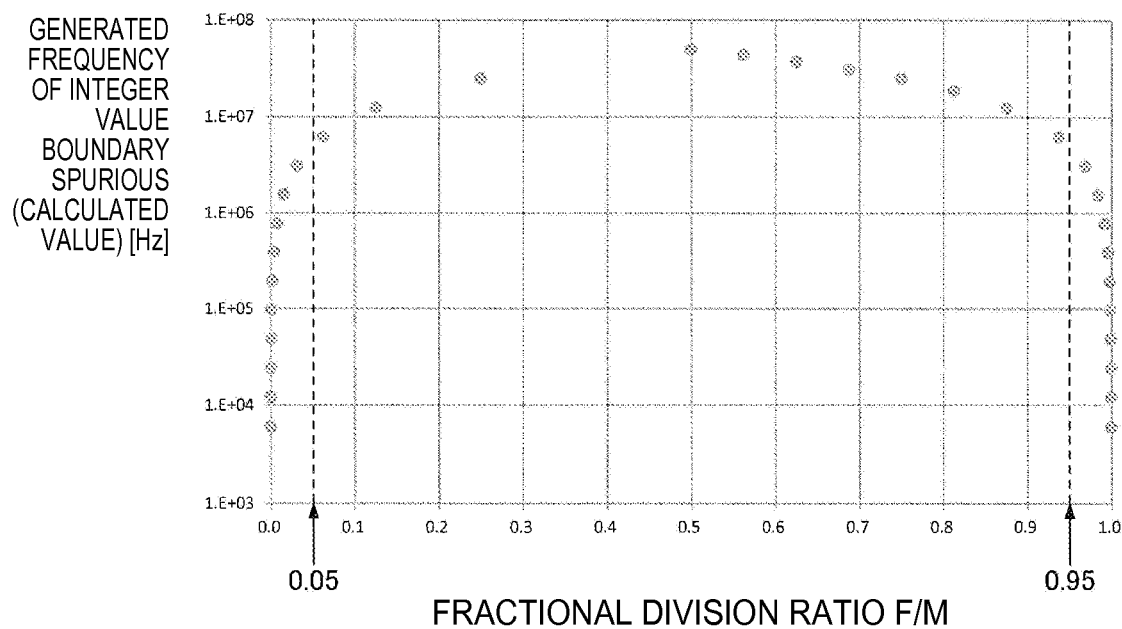
FIG. 8B is a diagram illustrating a relationship between the fractional division ratio and a calculated value of a frequency in which an integer value boundary spurious is generated.

FIG. 8A is a diagram illustrating a relationship between the fractional division ratio F/M and an actually measured value of phase jitter. As illustrated in FIG. 8A, it can be seen that, if the fractional division ratio F/M is in a range from a value equal to or higher than 0.05 to a value equal to or lower than 0.95, the phase jitter is not substantially generated and is rapidly generated out of the range. FIG. 8B is a diagram illustrating a relationship between the fractional division ratio and a calculated value of a frequency in which an integer value boundary spurious is generated. As illustrated in FIG. 8B, when the fractional division ratio F/M is near 0.05 or 0.95, the frequency in which the integer value boundary spurious is generated is approximately 7 MHz, and schematically matches the cutoff frequency (approximately 5 to 10 MHz) of the low pass filter. It can be seen from this fact that, in order not to generate phase noise or phase jitter, it is effective to set the fractional division ratio F/M to a range from a value equal to or higher than 0.05 to a value equal to or lower than 0.95.

According to the actually measured results described above, it is preferable that, in order to enable n types of predetermined frequencies to be selected as the output frequency of the oscillator 1, and to configure such that any frequency to be selected does not substantially have the phase noise or the phase jitter, the reference frequency be selected in such a manner that all the set values of the fractional division ratio F/M that are respectively included in the n division ratio set values stored in the non-volatile memory 90 are equal to or higher than 0.05 and are equal to or lower than 0.95. However, as n increases, it is actually difficult to maintain the set values of the fractional division ratio F/M as values equal to or higher than 0.05 and equal to or lower than 0.95 with regard to all combinations, and thus it is allowable that the set values of at least two fractional division ratios F/M are equal to or higher than 0.05 and are equal to or lower than 0.95, and the set values of the other fractional division ratios F/M are lower than 0.05 and are higher than 0.95. In addition, when mass-production of the oscillators 1 is performed, a margin is provided in consideration of variation of characteristics or the like, for example, the oscillator 1 may be configured in such a manner that the set values of at least two fractional division ratios F/M are equal to or higher than 0.1 and are equal to or lower than 0.9.

FIG. 9A is a table illustrating an example of the reference frequencies which are configured in such a manner that the set values of the fractional division ratios F/M that are respectively included in four division ratio set values are all equal to or higher than 0.05 and are equal to or lower than 0.95, in a case where four types of predetermined frequencies can be selected as the output frequency of the oscillator 1. Meanwhile, FIG. 9B is a comparative example, and is a table illustrating an example of the reference frequencies which are configured in such a manner that the set values of the fractional division ratios F/M are all equal to or higher than 0.05 and are equal to or lower than 0.95.

In FIG. 9A and FIG. 9B, any one of 162.492583 MHz, 174.703084 MHz, 699.326000 MHz, 724.032902 MHz can be selected as the output frequency. In FIG. 9A, 114.144444 MHz is selected as the reference frequency, and four fractional division frequencies F/M, such as 0.777117, 0.488703, 0.506703, and 0.372515 are all within a range from a value equal to or higher than 0.05 to a value equal to or lower than 0.95. In addition, even in a case where any one of the four types of output frequencies is selected, a frequency (IBS frequency column of FIG. 9A) in which the integer value boundary spurious is generated is out of the loop bandwidth. In contrast to this, in FIG. 9B, 100.000000 MHz is selected as the reference frequency, and four fractional division frequencies F/M, such as 0.998813, 0.952493, 0.973040, and 0.961316 are all out of a range from a value equal to or higher than 0.05 to a value equal to or lower than 0.95. In addition, even in a case where any one of the four types of output frequencies is selected, a frequency (IBS frequency column of FIG. 9B) in which the integer value boundary spurious is generated is within the loop bandwidth.

As can be seen from the examples of FIG. 9A and FIG. 9B, in the oscillator 1 according to the present embodiment, in a case where a combination of frequencies that can be output is determined, characteristics of the phase noise or the phase jitter are significantly changed by a selection of the reference frequency of the fractional N-PLL circuit 20, and thus it is important to determine an appropriate reference frequency.

Figure 10:
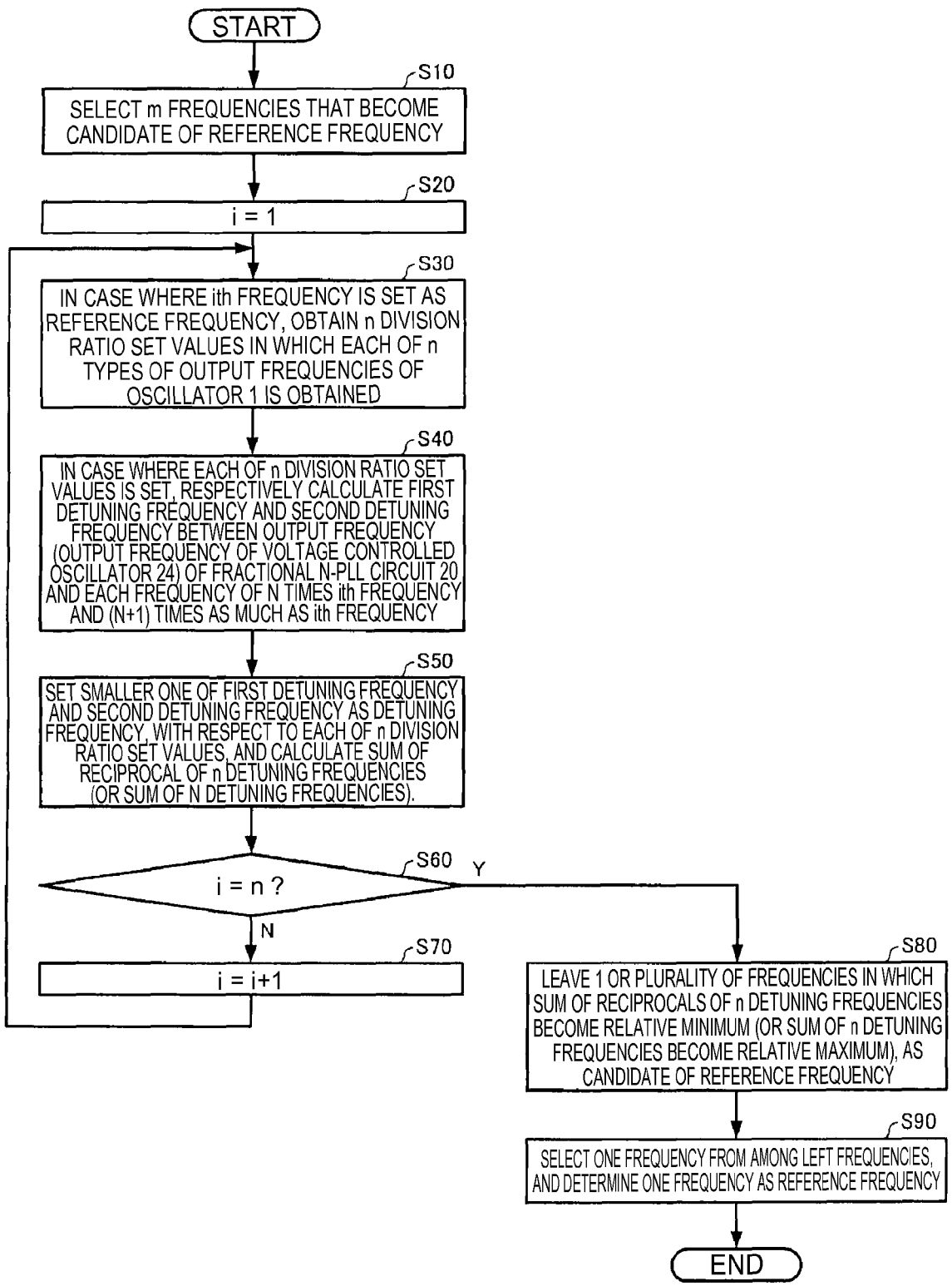
FIG. 10 is a flowchart illustrating an example of a determination method of a reference frequency of the fractional N-PLL circuit according to the present embodiment.

FIG. 10 is a flowchart illustrating an example of a determination method of the reference frequency of the fractional N-PLL circuit 20 according to the present embodiment.

In the method illustrated in FIG. 10, m frequencies that become a candidate of the reference frequency are first selected (S10), and subsequent processes are performed. For example, m frequencies that are arranged at regular intervals within a predetermined range determined in advance are selected as a candidate of the reference frequency, that is, m frequencies are sequentially selected while a predetermined frequency range is swept by a regular interval, and subsequent processes may be performed.

Next, it is set as i=1 (S20), and in a case where an ith frequency is selected as the reference frequency, n division ratio set values (integer division ratio N, fractional division ratio F/M and output division ratio P) in which each of n types of output frequencies of the oscillator 1 is obtained are obtained (S30).

Next, in a case where each of n division ratio set values is set, a first detuning frequency between the output frequency (output frequency of the voltage controlled oscillator 24) of the fractional N-PLL circuit 20 and a frequency of N times the ith frequency (reference frequency), and a second detuning frequency between the output frequency (output frequency of the voltage controlled oscillator 24) of the fractional N-PLL circuit 20 and a frequency of (N+1) times as much as the ith frequency (reference frequency) are respectively calculated (S40).

Next, with respect to each of the n division ratio set values, a smaller one of the first detuning frequency and the second detuning frequency is set as the detuning frequency, and the sum (or sum of n detuning frequencies) of the reciprocals of n detuning frequencies is calculated (S50).

Next, if not i=1 (N of S60), then i=i+1 (S70), and processes S30 to S70 are repeated until i=n.

Figure 11A:
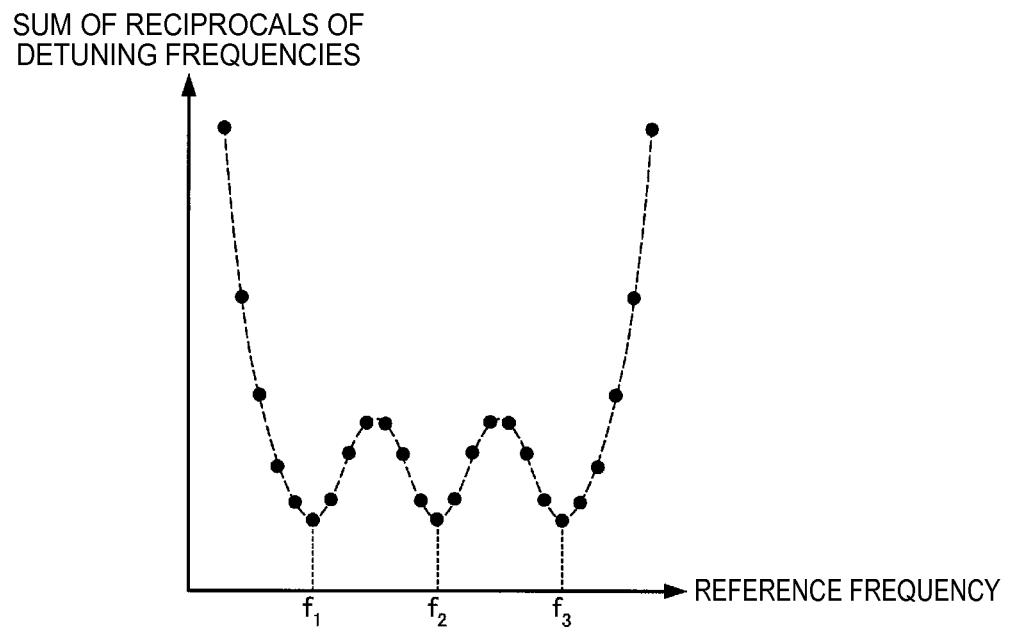
FIG. 11A is a diagram illustrating an example of a graph in which the sum of reciprocals of n detuning frequencies is plotted.
Figure 11B:
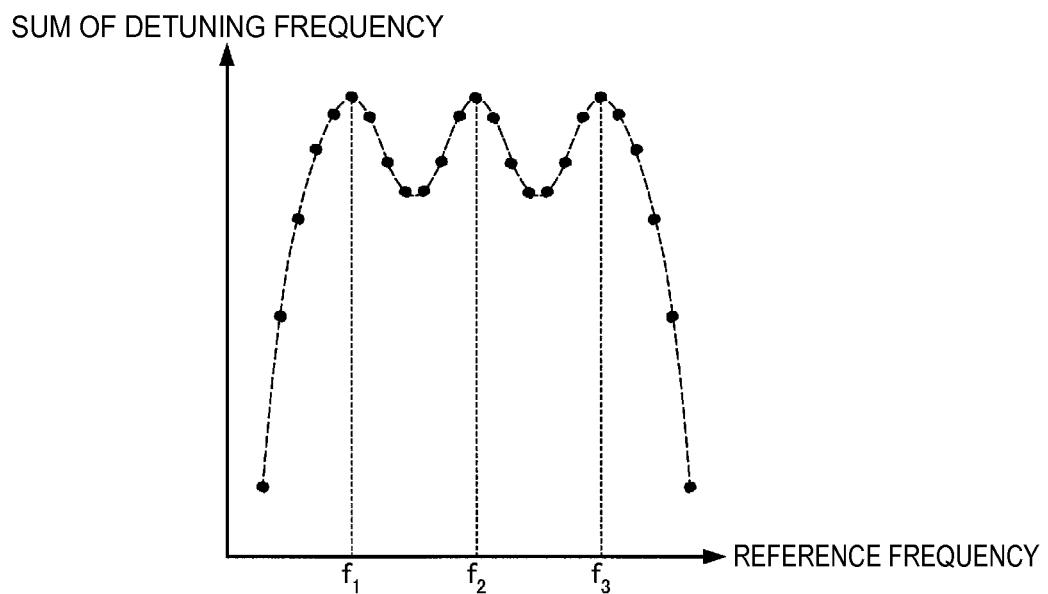
FIG. 11B is a diagram illustrating an example of a graph in which the sum of n detuning frequencies is plotted.

Then, if i=n (Y of S60), next, 1 in which the sum of the reciprocals of the n detuning frequencies becomes a relative minimum (or sum of n detuning frequencies becomes a relative maximum) or a plurality of frequencies are left as a candidate of the reference frequency (S80). FIG. 11A is a diagram illustrating the sum of reciprocals of n detuning frequencies obtained by respectively calculating 25 frequencies selected as a candidate of the reference frequency. In this case, three relative minimum frequencies $f_1$, $f_2$, and $f_3$ are left. In the same manner, FIG. 11B is a diagram illustrating the sum of n detuning frequencies obtained by respectively calculating 25 frequencies selected as a candidate of the reference frequency. In this case, three relative maximum frequencies $f_1$, $f_2$, and $f_3$ are left.

Finally, one frequency is selected from among the left frequencies, and the one frequency is determined as a reference frequency (S90). For example, among the left frequencies, frequencies in which set values of the n fractional division ratios F/M are all within a range from a value equal to or higher than 0.05 to a value equal to or lower than 0.95 may be firstly selected, and the highest minimum frequency of the n frequencies in which the integer value boundary spurious is generated may be secondly selected. In addition, instead of the processes S80 and S90, a frequency in which the sum of reciprocals of the n detuning frequencies becomes minimum (or sum of n detuning frequencies becomes maximum) may be determined as the reference frequency.

According to the determination method of the reference frequency of the fractional N-PLL circuit 20, it is possible to determine relatively and easily the reference frequency that can decrease an influence of the integer value boundary spurious which is generated in a case where each of a plurality of output frequencies of the voltage controlled oscillator 24 is selected.

In addition, as a method of matching the frequency of the oscillation signal CK1 that is output from the circuit for oscillation 10 with the determined reference frequency, there is a method of adjusting a resonance frequency by performing physical processing of the resonator 3, or a method of adjusting a capacitance value of a variable capacitance element that is provided as a load capacitance of the circuit for oscillation 10.

As described above, according to the oscillator 1 or the oscillation circuit 2 of the present embodiment, by selecting any one of the n division ratio set values stored in the non-volatile memory 90 from outside, it is possible to output one a plurality of frequencies that are obtained by dividing one reference frequency according to the selected division ratio set value. Then, by setting at least two fractional division ratios F/M stored in the non-volatile memory 90 to values equal to or higher than 0.05 and equal to or lower than 0.95, or by setting at least two fractional division ratios F/M stored in the non-volatile memory 90 to values which are set in such a manner that the integer value boundary spurious is generated out of a loop bandwidth, it is easy for the integer value boundary spurious to be attenuated by the low pass filter 23 of the fractional N-PLL circuit 20. Thus, according to the present embodiment, it is possible to provide an oscillator or an oscillation circuit that can output a plurality of frequencies, while decreasing generation of phase noise or phase jitter due to the integer value boundary spurious in one resonator (reference frequency).

2. Electronic Apparatus

Figure 12:
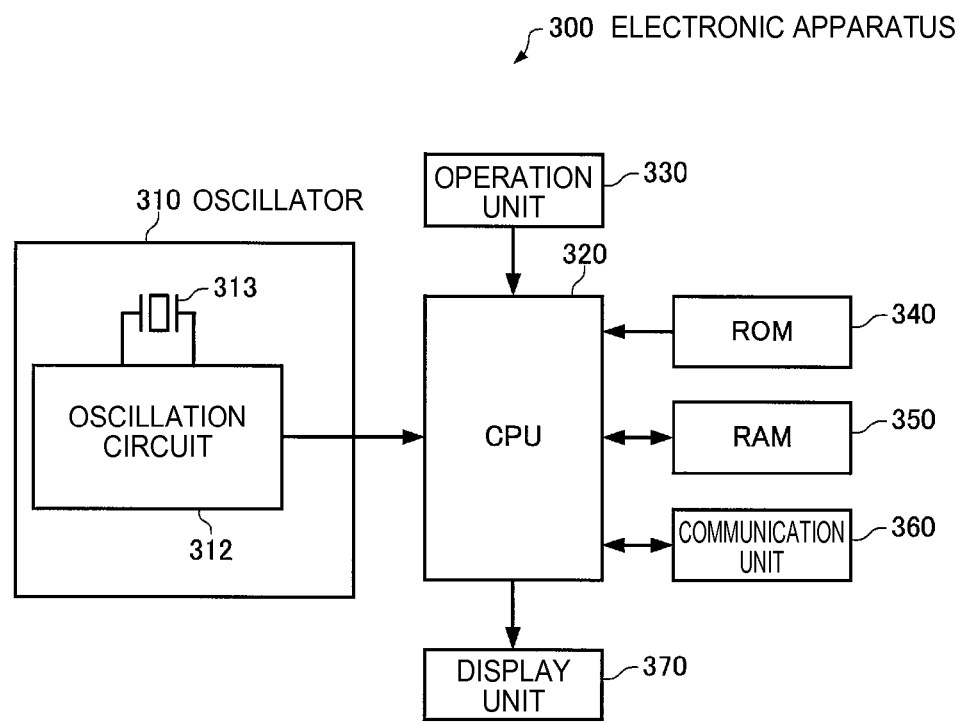
FIG. 12 is a functional block of an electronic apparatus according to the present embodiment.
Figure 13:
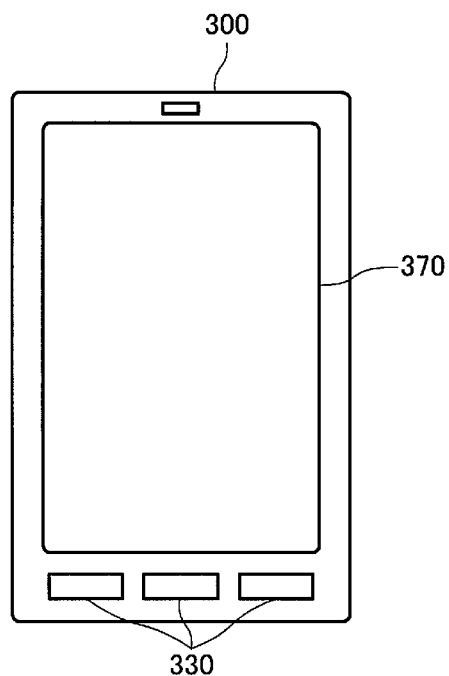
FIG. 13 is a diagram illustrating an example of an appearance of the electronic apparatus according to the present embodiment.

FIG. 12 is a functional block diagram of an electronic apparatus according to the present embodiment. In addition, FIG. 13 is a diagram illustrating an example of an appearance of a smart phone that is an example of an electronic apparatus according to the present embodiment.

The electronic apparatus 300 according to the present embodiment is configured to include an oscillator 310, a central processing unit (CPU) 320, an operation unit 330, a read only memory (ROM) 340, a random access memory (RAM) 350, a communication unit 360, and a display unit 370. In addition, the electronic apparatus according to the present embodiment may have a configuration in which a portion of the configuration elements (each unit) of FIG. 12 is omitted or modified, alternatively other configuration elements are attached.

The oscillator 310 includes an oscillation circuit 312, and a resonator 313. The oscillation circuit 312 generates an oscillation signal by oscillating the resonator 313. The oscillator 310 outputs the oscillation signal to the CPU 320.

The CPU 320 performs various calculation processing or control processing using the oscillation signal that is input from the oscillator 310 as a clock signal, according to a program stored in the ROM 340 or the like. Specifically, the CPU 320 performs various processing according to an operation signal from the operation unit 330, processing of controlling the communication unit 360 for performing data communication with an external device, processing of transmitting a display signal for displaying various information in the display unit 370, or the like.

The operation unit 330 is an input device that is configured by operation keys, button switches or the like, and outputs an operation signal according to an operation performed by a user to the CPU 320.

The ROM 340 stores a program through which the CPU 320 performs various calculation processing or control processing, data, or the like.

The RAM 350 is used as an work area of the CPU 320, and temporarily stores a program or data that is read from the ROM 340, data that is input from the operation unit 330, an arithmetic result that is obtained by performing various programs using the CPU 320, or the like.

The communication unit 360 performs various controls of performing data communication between the CPU 320 and an external device.

The display unit 370 is a display device that is configured by a liquid crystal display (LCD) or the like, and displays various information based on a display signal that is input from the CPU 320. A touch panel that functions as the operation unit 330 may be provided in the display unit 370.

As the oscillation circuit 312, for example, the oscillation circuit 2 according to the above-described embodiment is applied, or as the oscillator 310, for example, the oscillator 1 according to the above-described embodiment is applied, and thereby it is possible to realize an electronic apparatus with a high practicability or reliability.

As the electronic apparatus 300, various electronic apparatuses are considered, for example, a communication apparatus (for example, optical transmission device), a personal computer (for example, mobile type personal computer, laptop type personal computer, tablet type personal computer), a moving object terminal such as a smart phone or a mobile phone, a digital still camera, an ink jet type ejection device (for example, ink jet printer), a storage area network apparatus such as a router or a switch, a local area network apparatus, an apparatus for moving object terminal base station, a television, a video camera, a video recorder, a car navigation device, a real time clock device, a pager, an electronic notebook (also including communication function), an electronic dictionary, an electronic calculator, an electronic game apparatus, a controller for game, a word processor, a workstation, a television phone, a security television monitor, an electronic binocular, a POS terminal, a medical apparatus (for example, electronic thermometer, blood pressure monitor, blood glucose meter, electrocardiogram measuring device, ultrasonic diagnostic device, electronic endoscope), a fish finder, various measurement apparatus, instruments (for example, vehicle, aircraft, ship instruments), a flight simulator, a head-mounted display, motion trace, motion tracking, a motion controller, a pedestrian position orientation measurement (PDR), or the like may be used.

3. Moving Object

Figure 14:
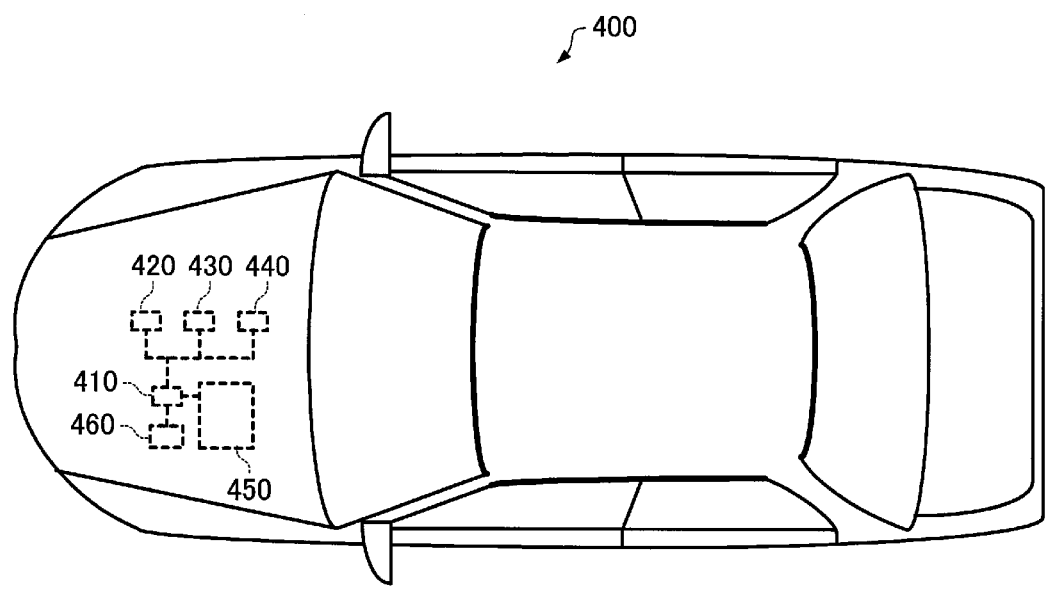
FIG. 14 is a diagram illustrating an example of a moving object according to the present embodiment.

FIG. 14 is a diagram (top view) illustrating an example of a moving object according to the present embodiment. The moving object 400 illustrated in FIG. 14 is configured to include an oscillator 410, controllers 420, 430, and 440 that perform various controls of an engine system, a brake system, a keyless entry system, or the like, a battery 450, and a backup battery 460. In addition, the moving object according to the present embodiment may have a configuration in which a portion of the configuration elements (each unit) illustrated in FIG. 14 is omitted, or other configuration elements are attached.

The oscillator 410 includes an oscillation circuit and a resonator that are not illustrated, and the oscillation circuit generates an oscillation signal by oscillating the resonator. The oscillation signal is output from an external terminal of the oscillator 410 to the controllers 420, 430, and 440, and for example, is used as a clock signal.

The battery 450 supplies power to the oscillator 410 and the controllers 420, 430, and 440. The backup battery 460 supplies power to the oscillator 410 and the controllers 420, 430, and 440, when an output voltage of the battery 450 is decreased to a voltage lower than a threshold.

As the oscillation circuit that is included in the oscillator 410, for example, the oscillation circuit 2 according to each embodiment described above is applied, or as the oscillator 410, for example, the oscillator 1 according to each embodiment described above is applied, and thereby it is possible to realize a moving object with a high practicability or reliability.

As the moving object 400, various moving objects are considered, for example, a vehicle (including an electric vehicle), an aircraft such as a jet or helicopter, a ship, a rocket, a satellite, or the like is used.

The invention is not limited to the present embodiments, and various modifications can be made within a range of a gist of the invention.

The embodiments and modified examples that are described above are just examples, while not being limited to this. For example, each embodiment and each modified example may be appropriately combined to each other.

The invention includes substantially the same configuration (for example, function, method, and configuration with the same results, alternatively configuration with the same purpose and effects) as the configuration described in the embodiment. In addition, the invention includes a configuration that is obtained by replacing non-essential portions of the configuration described in the embodiment with others. In addition, the invention includes a configuration having the same operations and effects as the configuration described in the embodiment, or a configuration in which the same purpose can be achieved. In addition, the invention includes a configuration that is obtained by adding the known technology to the configuration described in the embodiment.

The entire disclosure of Japanese Patent Application No. 2014-014342, filed Jan. 29, 2014 is expressly incorporated by reference herein.

What is claimed is:

1. A determination method of a reference frequency of a fractional N-PLL circuit, comprising:
    calculating, for each of a plurality of reference frequencies, a detuning frequency, wherein, for a given output frequency of an oscillation unit included in the fractional N-PLL circuit, the detuning frequency is between the given output frequency and a frequency that is an integer multiple of a respective reference frequency;
    calculating the sum of reciprocals of a plurality of detuning frequencies, or the sum of the plurality of detuning frequencies based on the detuning frequency calculated for each of the plurality of reference frequencies; and
    selecting one of the plurality of reference frequencies, in order to operate the fractional N-PLL circuit, based on the sum of reciprocals of the detuning frequencies, or the sum of the detuning frequencies.

2. The determination method of claim 1, further comprising:
    identifying at least one of the remaining reference frequencies based on whether a respective sum of reciprocals of the plurality of detuning frequencies is a minimum value or a maximum value.

3. The determination method of claim 2, further comprising:
    selecting one of the identified remaining reference frequencies based on a determination of which of the remaining reference frequencies have a fractional portion of a division ratio equal to or higher than 0.05 and equal to and lower than 0.95.

* * * * *